United States Patent

Wermuth

[11] 4,216,434
[45] Aug. 5, 1980

[54] VARIABLE GAIN ALTERNATING VOLTAGE AMPLIFIER

[75] Inventor: Jürgen Wermuth, Stederdorf, Fed. Rep. of Germany

[73] Assignee: Licentia Patent-Verwaltungs-G.m.b.H., Frankfurt am Main, Fed. Rep. of Germany

[21] Appl. No.: 40,213

[22] Filed: May 18, 1978

Related U.S. Application Data

[63] Continuation of Ser. No. 880,206, Feb. 22, 1978, abandoned.

[30] Foreign Application Priority Data

Feb. 22, 1977 [DE] Fed. Rep. of Germany ....... 2707609

[51] Int. Cl.² ............................................. H03G 3/00
[52] U.S. Cl. ...................................... 330/86; 330/282; 330/290
[58] Field of Search ..................... 330/86, 97, 282, 290

[56] References Cited

U.S. PATENT DOCUMENTS

| | | | |
|---|---|---|---|
| 3,569,603 | 3/1971 | Kern | 330/86 X |
| 3,679,986 | 7/1972 | Zaman | 330/86 |
| 3,764,745 | 10/1973 | Bottcher et al. | 330/282 X |

*Primary Examiner*—James B. Mullins
*Attorney, Agent, or Firm*—Spencer & Kaye

[57] ABSTRACT

A variable gain alternating voltage amplifier having a d.c. negative feedback loop for setting the operating point of the amplifier wherein a change in gain of the amplifier is effected by a variable resistance feedback loop which is connected in parallel with the d.c. negative feedback loop and includes the series connection of a controllable resistor and a capacitor.

10 Claims, 1 Drawing Figure

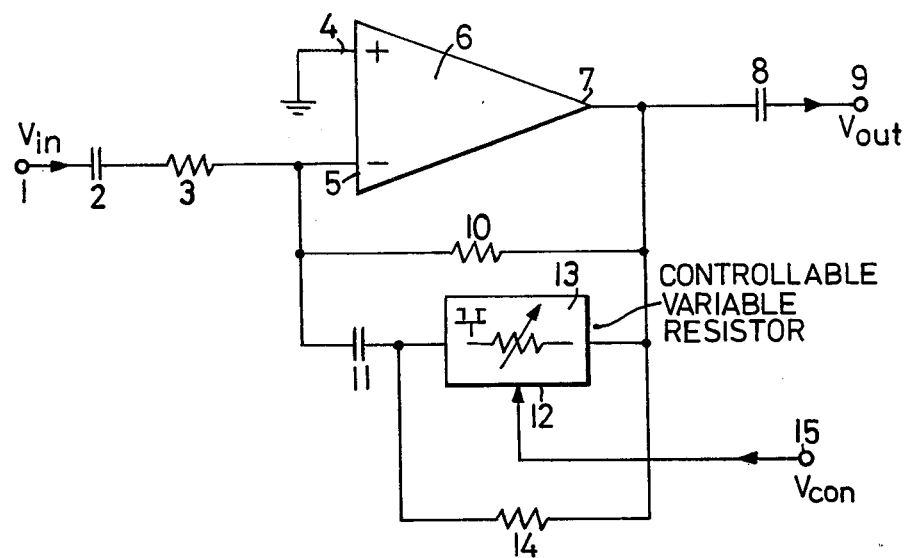

VARIABLE GAIN ALTERNATING VOLTAGE AMPLIFIER

CROSS REFERENCE TO RELATED APPLICATION

This application is a continuation of Applicant's copending United States application Ser. No. 880,206 filed Feb. 22, 1978, abandoned.

BACKGROUND OF THE INVENTION

The present invention relates to a variable gain alternating voltage amplifier having a d.c. feedback loop provided for setting the operating point of the amplifier.

Controllable amplifiers are required, for example, to suppress noise in audio frequency signals in compander systems.

A simple circuit with good control properties for a controllable amplifier is an amplifier with a controllable feedback loop. In order to set the operating point of such an amplifier, it may be necessary to provide a d.c. feedback loop. If, in this case, the desired change in gain of the amplifier were provided by variation of the resistance of a controllable resistor disposed in the d.c. feedback loop this would have the result, for example, that relatively fast changes in gain would appear as simulated signals at the input of the amplifier.

The reason for this is that in the above-described case a change in the negative feedback resistance would have the same effect as a change in the operating point. This again would have the same effect as a correspondingly changing signal at the input of the amplifier.

SUMMARY OF THE INVENTION

It is the object of the invention to prevent the above-mentioned drawbacks in a variable gain alternating current amplifier having a d.c. negative feedback loop for setting the operating point of the amplifier without major additional expenditures so that it is still possible to obtain relatively fast changes in amplification without the described drawbacks.

This is accomplished by the present invention in that in a variable gain alternating voltage amplifier having a d.c. negative feedback loop for setting the operating point of the amplifier, a variable resistance feedback loop is provided in order to effect a change in the gain of the amplifier, with this variable resistance feedback loop being connected in parallel with the d.c. negative feedback loop and including the series connection of a controllable resistor and a capacitor.

Preferably the controllable resistor is electronically controllable, e.g., a field effect transistor whose control or gate electrode receives a control voltage which varies the resistance of the field effect transistor. According to the preferred embodiment of the invention, the amplifier is a differential amplifier whose inverting input receives the input signal to be amplified, as well as the feedback signals, and whose noninverting input is connected to a reference voltage, e.g. ground. Moreover according to an advantageous feature of the invention, a further resistor, whose resistance is less than the leakage resistance of the capacitor connected in series with the controllable resistor in the feedback loop, is connected in parallel with the controllable resistor.

BRIEF DESCRIPTION OF THE DRAWINGS

The FIGURE is a circuit diagram of a preferred embodiment of the invention.

DETAILED DESCRIPTION OF THE PREFERRED EMBODIMENT

The FIGURE shows a circuit for a controllable amplifier having an input terminal 1 for the useful alternating voltage $V_{in}$ to be processed and an output terminal 9 for the output voltage $V_{out}$. The amplification or gain of the described circuit can be controlled by means of a control voltage $V_{con}$ fed to a control input 15.

The amplifying element as shown is a differential amplifier 6 which is connected as an inverting amplifier. For this reason the useful alternating voltage $V_{in}$ is fed to the inverting input 5 of the amplifier 6 via a capacitor 2 and a resistor 3. The noninverting input 4 of amplifier 6 is connected to a reference voltage, e.g., ground as shown. The output 7 of the differential amplifier 6 is connected with the output terminal 9 of the described circuit via a capacitor 8.

The amplifier 6 has a d.c. negative feedback loop including a resistor 10 connected between its output 7 and its inverting input 5. This d.c. negative feedback loop with the ohmic resistor 10 is codeterminative for the operating point of the amplifier 6.

In order to vary the gain of amplifier 6, an alternating voltage feedback path is provided which is connected in parallel with resistor 10 and includes a series connection of a capacitor 11 and a controllable resistor 13. The controllable resistor 13 has a control input 12 which is connected with the control voltage input terminal 15 of the described circuit. The controllable resistor 13 is of the type which can have its resistance value electronically changed via the voltage applied to the control input 12. The component representing the controllable resistor 13 is advantageously a field effect transistor whose control or gate electrode receives the control voltage $V_{con}$ present at the control input 12.

Due to the fact that, in the described circuit, the change in amplification is effected by a change in the resistor 13 disposed in the alternating voltage feedback loop, the d.c. negative feedback loop remains unchanged. The change in the controllable resistor 13 thus does not result in a noticeable change in the direct voltage potential at the inverting input 5 of amplifier 6. Otherwise such a change would have the same drawback as a simulated useful signal at the input 5 of the amplifier 6.

Particularly in the case where the resistance value of the controllable resistor 13 becomes relatively high, it is of advantage to bridge this resistor 13 with a further resistor 14. The value of this additional resistor 14 is advantageously dimensioned so that it is smaller than the leakage resistance of capacitor 11. In this way it is assured that the capacitor 11 cannot discharge beyond its leakage resistance if the controllable resistor 13 is controlled to a very high value. The described case may occur, for example, when the above-described circuit is used as a controllable amplifier in the control circuit of a compander system and the dynamics of the useful signal to be processed are regulated down to the order of magnitude of noise.

The present invention is not limited to use in an inverting amplifier. It may also be used with advantage if the amplifier is of the noninverting type. In this case the useful signal $V_{in}$ is then fed appropriately to the noninverting input 4 of the amplifier.

With one preferred embodiment there have been used elements with the following values:

capacitor 2: 100 μF
resistor 3: 2 kΩ ... 4.7 kΩ
integrated circuit 6: RC 4136 DP
capacitor 8: 100 μF
resistor 10: 33.2 kΩ
capacitor 11: 100 μF
controllable resistor 13: 250 Ω ... 25 kΩ (E 420; 2 N 5911)
resistor 14: 330 kΩ
frequency range: 30 Hz ... 20 kHz It will be understood that the above description of the present invention is susceptible to various modifications, changes and adaptations, and the same are intended to be comprehended within the meaning and range of equivalents of the appended claims.

What is claimed is:

1. In a variable gain alternating voltage amplifier having a d.c. negative feedback loop connected between the output and input of the amplifier for setting the operating point of the amplifier, the improvement wherein a variable resistance feedback loop is connected directly in parallel with said d.c. feedback loop for effecting a change in gain in said amplifier, said variable resistance feedback loop including the series connection of an electronically controllable resistor and a capacitor with one terminal of said capacitor being connected to said input of said amplifier and with one terminal of said controllable resistor being directly connected to said output of said amplifier.

2. An amplifier as defined in claim 1 wherein said controllable resistor is a field effect transistor whose control electrode is connected to an input terminal for a control voltage whose amplitude value controls the value of the resistance of the field effect transistor.

3. An amplifier as defined in claim 1 wherein: said amplifier is a differential amplifier having an inverting and a noninverting input; said d.c. negative feedback loop is connected to said inverting input of said amplifier; and one of said inverting and noninverting inputs is connected to an input terminal for the alternating voltage input signal to be amplified.

4. An amplifier as defined in claim 3 wherein said noninverting input is connected to a reference voltage and said inverting input is connected to said input terminal for the alternating voltage useful input signal to be amplified.

5. An amplifier as defined in claim 4 wherein said input terminal for the alternating voltage useful input signal to be amplified is connected to said inverting input of said amplifier via a series connection including a capacitor and an ohmic resistor with said ohmic resistor being connected to said inverting input.

6. An amplifier as defined in claim 4 wherein an additional resistor is connected in parallel with said controllable resistor.

7. An amplifier as defined in claim 6 wherein the resistance value of said additonal resistor is less than the leakage resistance of said capacitor connected in series with said controllable resistor.

8. An amplifier as defined in claim 4 wherein said controllable resistor is a field effect transistor whose control electrode is connected to an input terminal for a control voltage.

9. An amplifier as defined in claim 1 wherein an additional resistor is connected in parallel with said controllable resistor.

10. An amplifier as defined in claim 9 wherein the resistance value of said additional resistor is less than the leakage resistance of said capacitor connector in series with said controllable resistor.

11. In a variable gain alternating voltage amplifier having a d.c. negative feedback loop connected between the output and input of the amplifier for setting the operating point of the amplifier, the improvement wherein a variable resistance feedback loop is connected directly in parallel with said d.c. feedback loop for effecting a frequency independent change in gain in said amplifier, said variable resistance feedback loop including the series connection of an electronically controllable resistor and a capacitor with one terminal of said capacitor being connected to said input of said amplifier.

* * * * *